United States Patent
Chen

(10) Patent No.: US 6,528,434 B2
(45) Date of Patent: Mar. 4, 2003

(54) METHOD OF FORMING A SILICON OXIDE LAYER USING PULSED NITROGEN PLASMA IMPLANTATION

(75) Inventor: Wei-Wen Chen, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,810

(22) Filed: Oct. 22, 2001

(65) Prior Publication Data

US 2002/0127882 A1 Sep. 12, 2002

(30) Foreign Application Priority Data

Mar. 9, 2001 (TW) .......................... 90105625 A

(51) Int. Cl.[7] .............................................. H01L 21/31
(52) U.S. Cl. ...................... 438/787; 438/788; 438/766; 438/769; 438/440; 438/775; 438/776; 438/777
(58) Field of Search ................................ 438/776, 142, 438/275, 279, 528, 520, 766, 598, 769, 440, 787, 788, 775, 777; 427/38

(56) References Cited

U.S. PATENT DOCUMENTS

| | | | | |
|---|---|---|---|---|
| 4,764,394 A | * | 8/1988 | Conrad .......................... | 438/38 |
| 5,308,787 A | * | 5/1994 | Hong et al. .................. | 438/440 |
| 5,882,993 A | * | 3/1999 | Gardner et al. ............. | 438/591 |
| 5,918,133 A | * | 6/1999 | Gardner et al. ............. | 438/299 |
| 5,942,780 A | * | 8/1999 | Barsan et al. ................ | 257/321 |
| 6,165,849 A | * | 12/2000 | An et al. ..................... | 438/275 |

OTHER PUBLICATIONS

H. R. Soleimani et al., Formation of Ultrathin Nitrided SiO2 Oxides by Direct Nitrogen Implatation into Silicon, J Electrochem Soc, vol. 142, No. 8, pp L132–I34.*
B. Doyle et al.., Simultaneous Growth of Different Thickness Gate Oxides in Silicon CMOS Processing, IEEE Electron Device Letters, vol. 16, No. 7, Jul. 1995.*

* cited by examiner

Primary Examiner—Matthew Smith
Assistant Examiner—Belur V. Keshavan
(74) Attorney, Agent, or Firm—Winston Hsu

(57) ABSTRACT

The present invention provides a method of forming different thickness" of a gate oxide layer simultaneously, by employing a pulse Nitrogen plasma implantation. The method provides a semiconductor substrate with the surface of the silicon in the semiconductor substrate separated into a first region and a second region at least. Then a thin surface on the surface of the silicon of the first region is implanted using a first predetermined concentration of the Nitrogen ions. The thin surface on the surface of the silicon in the second region is implanted using a second predetermined concentration of the Nitrogen ions. An oxidation process is subsequently performed. The first predetermined thickness and the second predetermined thickness of the silicon oxide layer are formed simultaneously on the surface of the silicon in the first region and in the second region. The Nitrogen ions are implanted in the surface of the silicon by forming the pulse nitrogen plasma in-situ. The first predetermined concentration is not equal to the second predetermined concentration.

20 Claims, 9 Drawing Sheets

METHOD OF FORMING A SILICON OXIDE LAYER USING PULSED NITROGEN PLASMA IMPLANTATION

BACKGROUND OF INVENTION

1. Field of the Invention

The present invention relates to the field of semiconductor devices and their manufacture, and more particularly, to a method of forming a silicon oxide layer with different thickness using pulsed nitrogen plasma implantation.

2. Description of the Prior Art

Metal-oxide-semiconductor (MOS) transistors usually function as an on/off switch device for a control signal. A MOS transistor comprises a gate electrode, a source/drain (S/D), and a silicon substrate. A gate oxide layer is thermally formed between the gate and the silicon substrate.

Circuits having different functions have been integrated on a single semiconductor wafer due to progress in design and technology, and now form what is called an embedded wafer. MOS transistors having different functions on the embedded wafer have different threshold voltages. This can be seen in a periphery I/O circuit with a core circuit of the logic integrated circuit having a different threshold voltage. The threshold voltage of the periphery I/O circuit is 3.3 volts, with the threshold voltage of the core circuit equal to 1.5 volts. The method of forming different thickness" of the gate oxide layer usually defines the threshold voltage value. The gate oxide layer is formed by performing a thermal oxidation process to oxidize the silicon substrate to form a silicon dioxide, with the thickness of the gate oxide layer thinner when the quality control is more difficult. Since the gate oxide layer properties influence the electrical properties of the MOS transistor as in the threshold voltage and the breakdown voltage, the key concern is the method to fabricate a gate oxide layer.

Please refer to FIG. 1 to FIG. 3. FIG. 1 to FIG. 3 are schematic diagrams of a fabrication of a silicon oxide layer 16 and 19 on a semiconductor substrate 10. The semiconductor substrate 10 comprises a first region 22 and a second region 24. An isolation trench 14 separates the first region 22 as shown in FIG. 1. A mask (e.g., a silicon nitride layer) 12 is formed on the surface of the semiconductor substrate 10, with the mask 12 covering the first region 22 and exposing the second region 24. A thermal oxidation process is then performed to form a silicon oxide layer 16 on the exposed second region 24. An example of the thermal oxidation process is the Dry-Wet-Dry (DWD) process known in the art. Typically, the thermal oxidation process is performed in a temperature range from 900° C. to 1100° C. in a furnace for 6 hours to 8 hours. The mask 12 is subsequently removed.

As shown in FIG. 3, a second mask 18 is formed on the surface of the semiconductor substrate 10 to mask the second region 24 and to expose the first region 22. A thermal oxidation process is performed in a furnace in order to form a silicon oxide layer 19.

The gate oxide layer process in the prior art is formed using furnace oxidation technique known in the art. The process has a cycle time of 6 hours to 7 hours for completion of one batch. The lithography process is performed 2 or 3 times to form the different thickness of the gate oxide layer, with the different regions exposed by different photoresist layers. Finally the oxidation process is performed alone. Therefore, the different thickness of the gate oxide layer in the prior art is very slow and complicated thus affecting the throughput.

SUMMARY OF INVENTION

It is therefore the primary object of the present invention to provide a method for forming an oxide layer having a varying thickness in one cycle so as to increase throughput.

It is another object of the present invention to provide a method for a pulsed nitrogen plasma implantation of the silicon oxide layer.

In an embodiment of the present invention, a semiconductor substrate is firstly provided, which comprises a silicon surface with a first region and a second region. The method comprises firstly implanting a thin surface of the first region of the silicon surface by using a first predetermined concentration of Nitrogen ions. Then a thin surface of the second region of the silicon surface is implanted by using a second predetermined concentration of Nitrogen ions. An oxidation process is subsequently performed. The first predetermined thickness and the second predetermined thickness of the silicon oxide layer are formed simultaneously on the surface of the silicon in the first region and in the second region. Nitrogen ions are implanted in the surface of the silicon by forming the pulse nitrogen plasma in-situ. The first predetermined concentration is not equal to the second predetermined concentration.

It is an advantage of the present invention that the pulsed Nitrogen ion implantation process provides a thin distribution of the Nitrogen ions on the surface of the doped silicon, so the thickness of the gate oxide layer is limited in the subsequent thermal oxidation process. In addition, in other embodiments of the present invention, three or more different thickness of gate oxide layers are formed in one thermal oxidation process by using silicon surfaces doped with different dosages of Nitrogen ions cooperated with the undoped silicon surface.

These and other objectives of the present invention will no doubt become obvious to those of ordinary skill in the art after having read the following detailed description of the preferred embodiment, which is illustrated in the various figures and drawings.

DETAILED DESCRIPTION

The application of the present invention is in the field of pulsed plasma processing apparatuses comprising a parallel plate plasma processing apparatus and an electron cyclotron resonance (ECR) and the inductive coupled plasma (ICP), or other apparatuses of pulsed plasma technology. The following are examples of the parallel plate plasma processing apparatus for the present invention.

Figure 1:
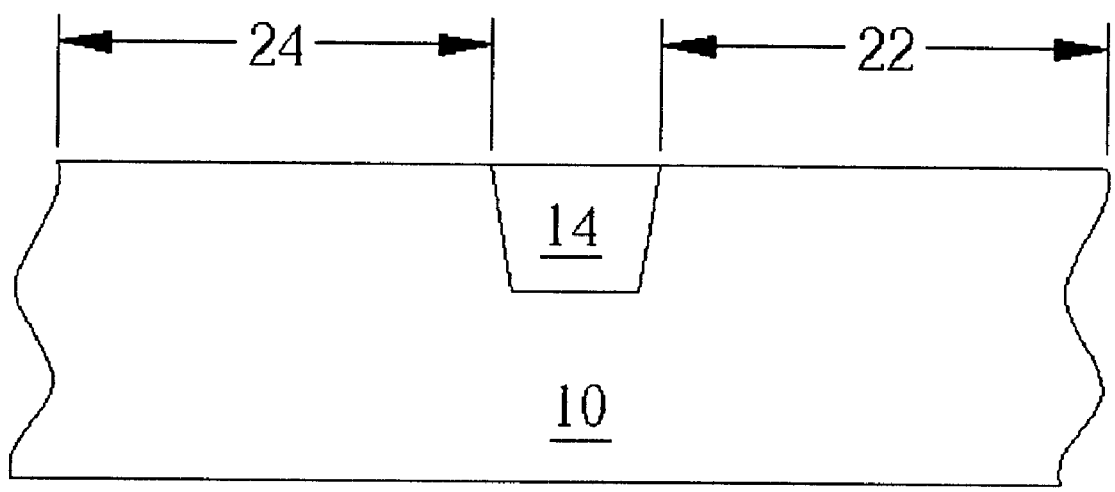
FIG. 1 to FIG. 3 are schematic diagrams of a method to fabricate different thickness of the silicon oxide layer in the prior art.
Figure 2:
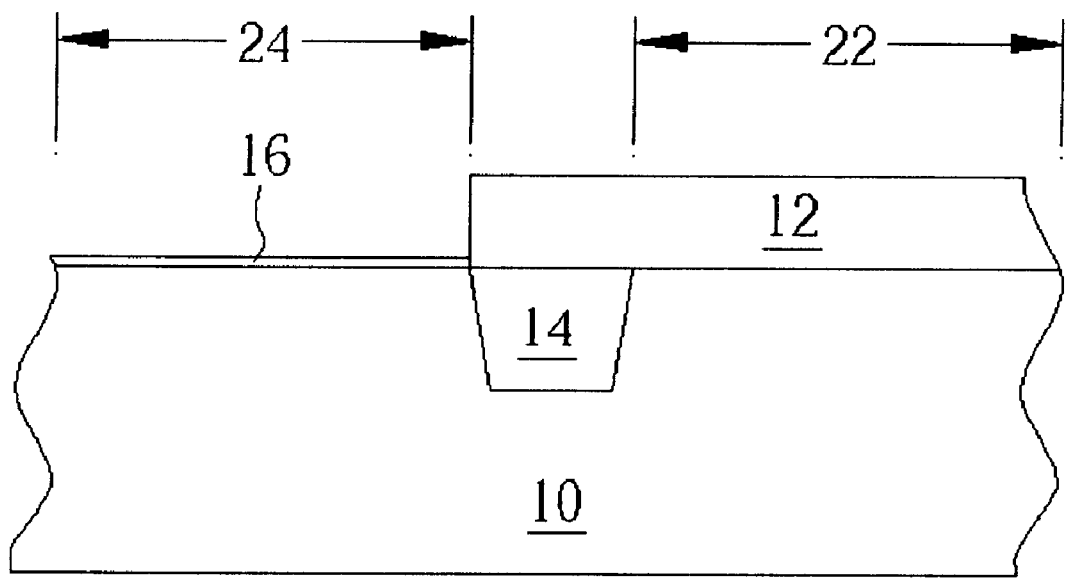
Figure 3:
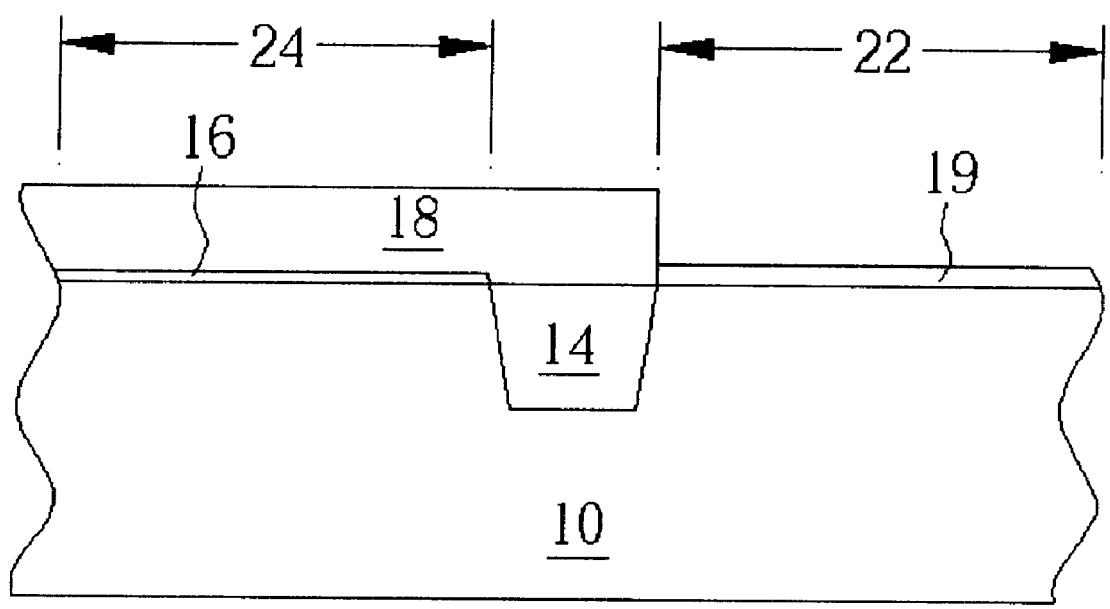
Figure 4:
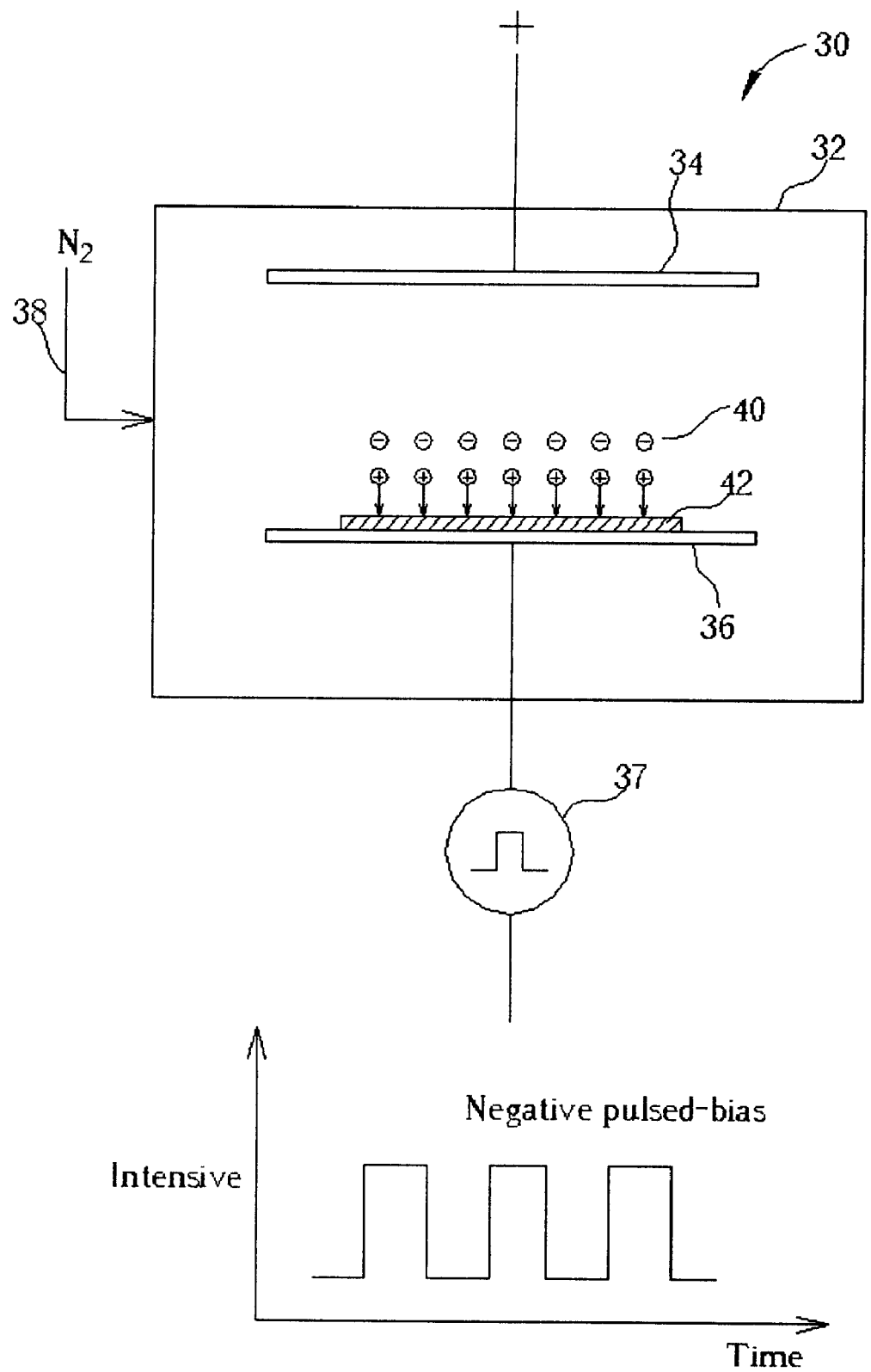
FIG. 4 is a schematic diagram of a parallel electrode plasma platform of the present invention.

Please refer to FIG. 4 of a schematic diagram of a parallel plate plasma processing apparatus 30 in the present invention. As shown in FIG. 4 the parallel plate plasma apparatus 30 comprises an airtight chamber 32 and a pair of parallel plates that are separated a predetermined distance. An upper electric plate 34 is at a positive voltage and a downward plate 36 is set at a pulsed bias 37. The Nitrogen 38 of the constant flux enters the airtight chamber 32 with the Nitrogen 38 under a constant pressure and becomes the laminate state. The downward plate 36 is set at a pulsed wireless bias by laminate Nitrogen that flows through the airtight chamber 32 resulting in a uniform and intermittent pulsed Nitrogen plasma 40 being produced. The semiconductor wafer 42 is located on the downward plate 36. The Nitrogen ions with the positive charge in the pulsed Nitrogen plasma 40 break the surface of the semiconductor wafer 42 rapidly in order to implant the Nitrogen ions.

The present invention is not limited in the pulsed plasma apparatus of someone special platform. Any pulsed Nitrogen plasma platform that can produce the equivalent pulsed Nitrogen plasma in the present invention may be employed in the present invention. The constraints of the process, besides the size of the parallel plate plasma platform in the previous case, the distance between the parallel plates, the reactive pressure and the Nitrogen flux and the amount of the pulsed voltage and the time period of the reaction; can be adapted by one of ordinary skill in the art in order to achieve the same purpose of the present invention.

Figure 5:
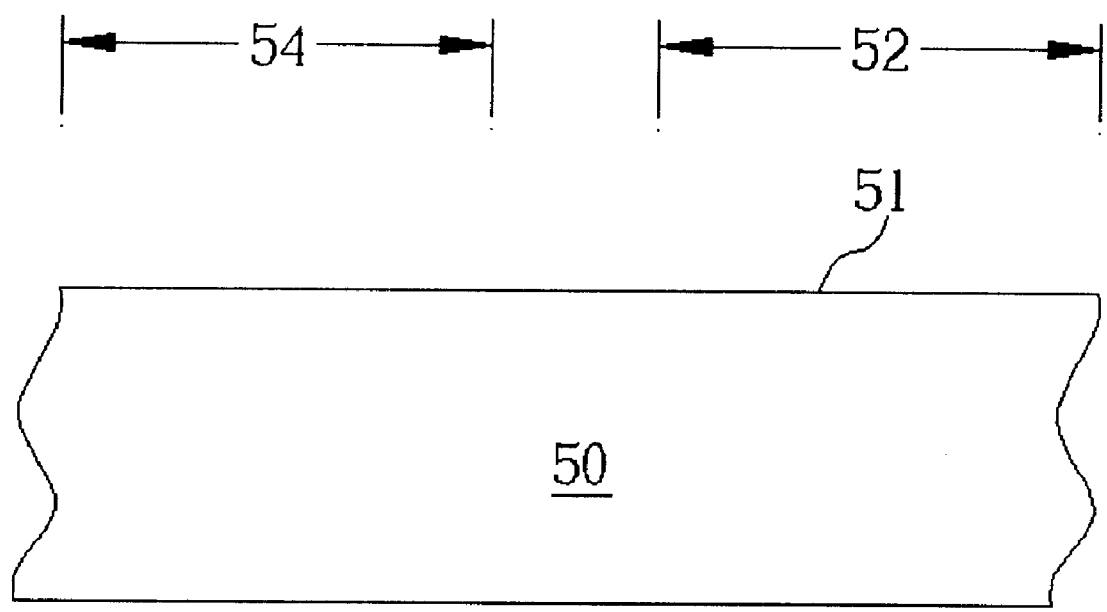
FIG. 5 to FIG. 8 are schematic diagrams of the method of the preferred embodiment in the present invention.
Figure 6:
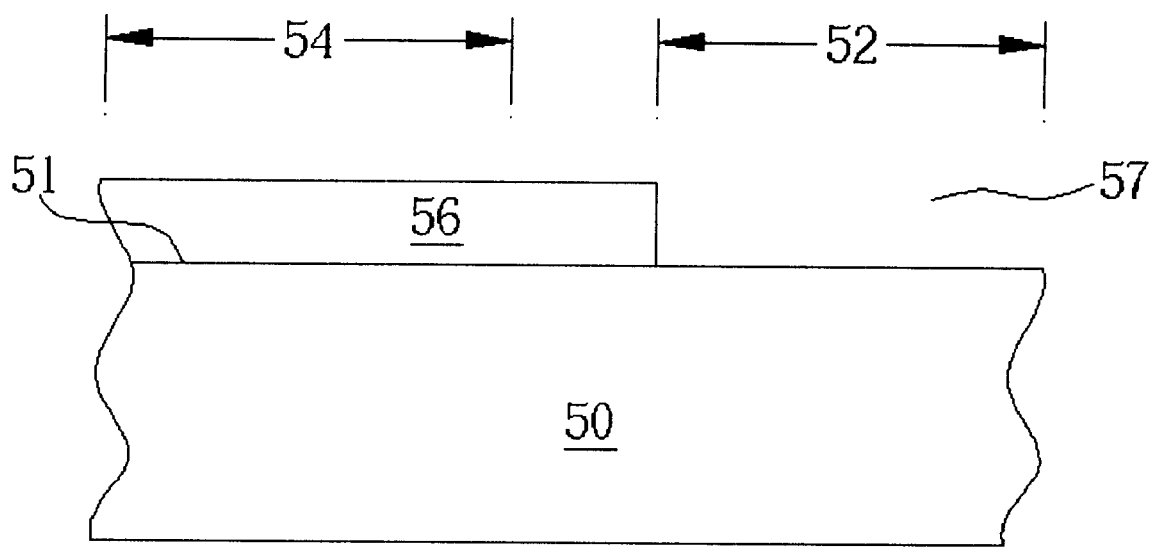
Figure 7:
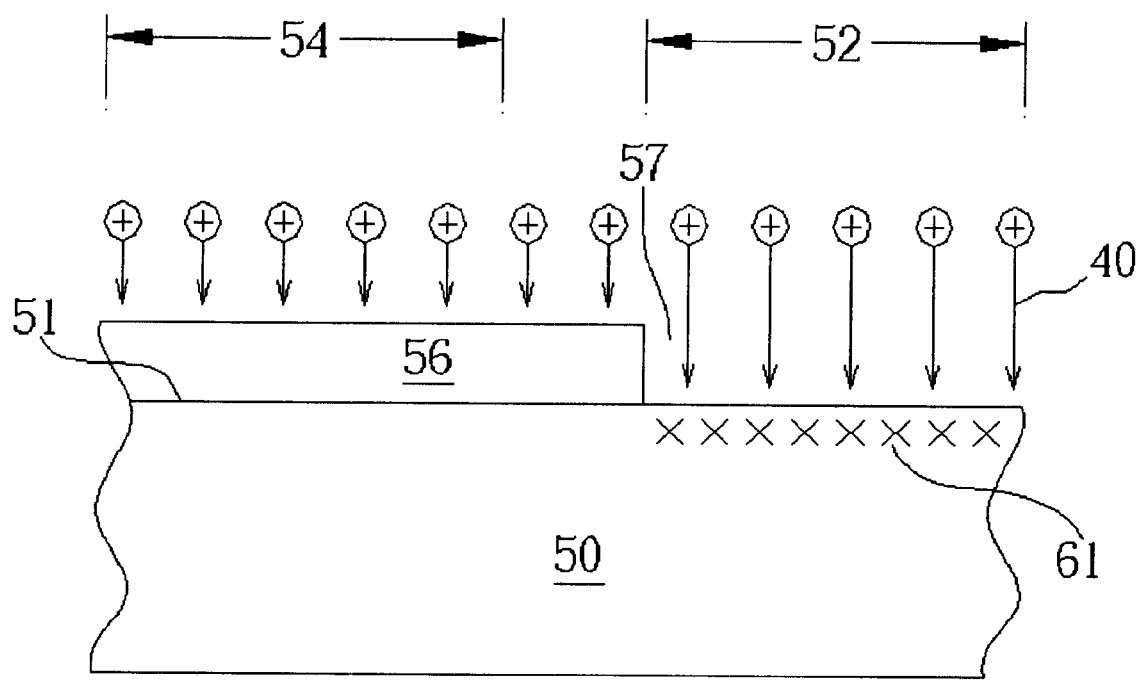

Please refer to FIG. 5 to FIG. 8. FIG. 5 to FIG. 8 are schematic diagrams of a method to form the different thickness" of the silicon oxide layer 62 and 63 in one process cycle on the semiconductor substrate 50 in the present invention. The semiconductor substrate 50 comprises a surface of the silicon 51 that is divided into at least one first region 52 and one second region 54 as shown in FIG. 5. The first region 52 functions to form a gate oxide layer thinner than that in a second region 54 in the preferred embodiment of the present invention. The first region 52 can be a core circuit region in an integrated wafer and the second region 54 can be a periphery input and output circuit region in an integrated wafer in other embodiments.

A photoresist layer 56 is formed on the surface 51 of the silicon and covers the first region 52, the photoresist layer 56 is defined. Let the photoresist layer 56 comprise a hole 57 which exposes the surface of the silicon 51 on the first region 52.

A Nitrogen ion implantation process 60 is performed by the pulsed Nitrogen plasma platform mentioned above as shown in FIG. 7. The negative pulsed bias is set on the semiconductor substrate 50. The predetermined concentration 61 of the Nitrogen ions are implanted on the surface 51 of the silicon in the first region 52 through the hole 57. The concentration of the Nitrogen ions 61 implanted in the first region 52 is between 1E19 atoms/cm$^3$ and 1E22 atoms/cm$^3$ in the preferred embodiment of the present invention. The photoresist layer 56 is subsequently removed. Since the Nitrogen plasma is produced immediately, the energy is less and a thinner dosage distribution is produced.

The energy of the Nitrogen ions in the Nitrogen ion implantation process 60 is in the range between 50 eV and 10 KeV. The actual energy is about 200 eV. The dosage is between 1E13 cm$^{-2}$ and 1E16 cm$^{-2}$, with the optimum dosage equal to 1E15 cm$^{-2}$. There is more than 80% Nitrogen ion implantation on the surface of the silicon 51 in the first region, thats depth is about 50 angstroms. Most of the Nitrogen ions dosage is on the thinner surface of silicon 51. The surface of the silicon 51 is attacked by the Nitrogen ions to decrease the size of the surface of the silicon. It is helpful for the completeness of the interface of the silicon (silicon dioxide) in the proceeding thermal oxidation process. The negative pulsed voltage set on the semiconductor substrate 50 can refresh the process to form the positive electric Nitrogen ions in the Nitrogen plasma above the semiconductor substrate 50.

Figure 8:
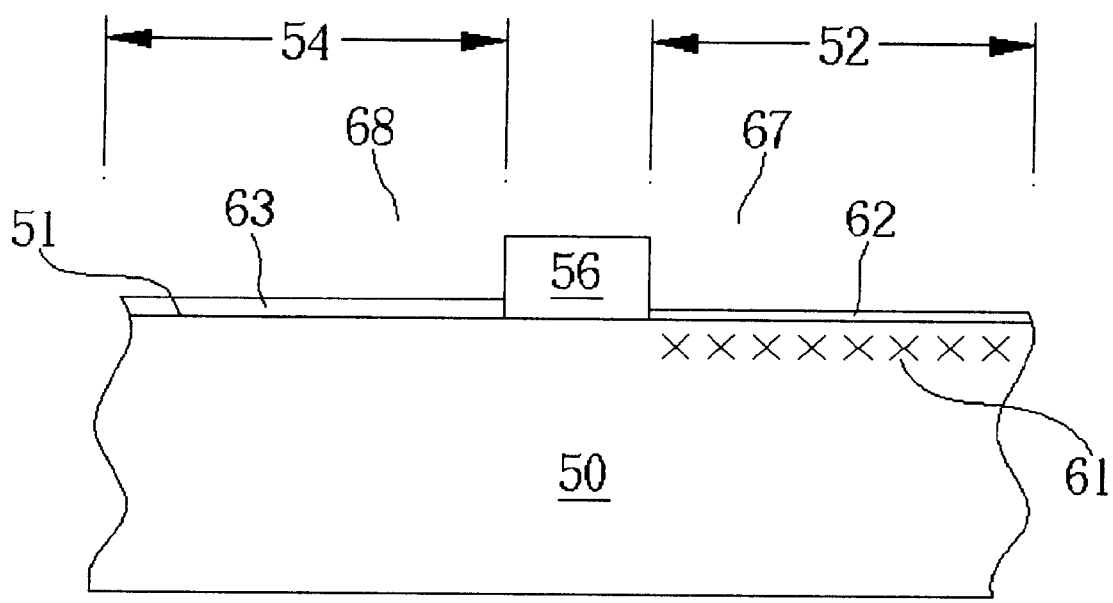

A photoresist layer 58 is formed on the surface of the silicon 51 and covers the first region 52 and the second region 54 as shown in FIG. 8. Then the lithography technology is performed to pattern the photoresist layer 58. The photoresist layer 58 comprises a second hole 67 and a third hole 68, by which the surface of the silicon 51 in the first region 52 and the surface of the silicon in the second region 54 are exposed. Finally the oxidation process is performed, in order to form the first predetermined thickness on the silicon oxide layer 62 and the second predetermined thickness on the silicon oxide layer 63, and on the surface of the silicon 51 in the first region 52 and in the second region 54 simultaneously. The first predetermined thickness being thinner than the second predetermined thickness. The oxidation process is a dry furnace oxidation process with the reaction temperature between 700° C. and 950° C.

Figure 9:
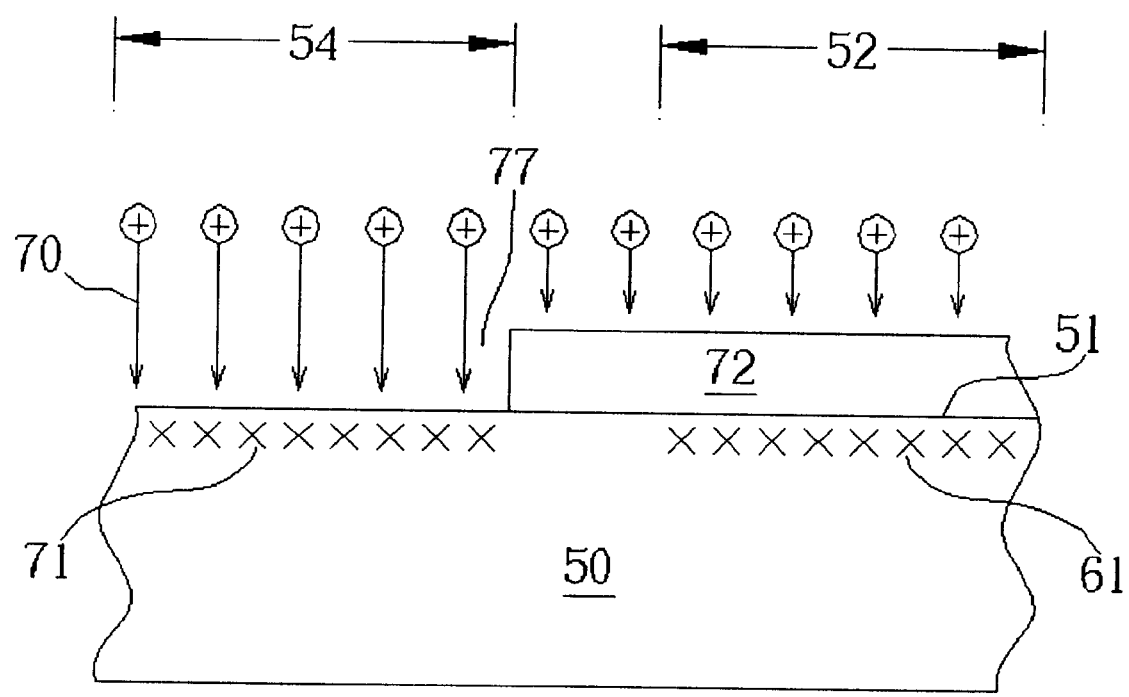
FIG. 9 is a schematic diagram of another preferred embodiment of the present invention.

Please refer to FIG. 9 of a schematic diagram of a method of another embodiment in the present invention. The thin Nitrogen ion implantation 61 is formed on the surface of the silicon 51 in the first region 52 of the semiconductor substrate 50 in the another embodiment of the present invention as shown in FIG. 9. The present invention can use another photoresist layer 72 continuously and the first region 52, in the another photomask screen. A hole 77 in the photoresist layer 72 exposes the surface of the silicon 51 in the second region 54. Then a second Nitrogen ion implantation process 70 is performed to implant a predetermined concentration of the Nitrogen ions 71 on the surface of the silicon 51 in the second region 54 through the hole 77. The second region 54 is implanted with the Nitrogen ions 71 thats concentration is between 1E19 atoms/cm$^3$ and 1E22 atoms/cm$^3$ in the embodiment. The photoresist layer 72 is removed. The steps of the proceeding process are the same as those shown as in FIG. 8 and are not mentioned here. The different concentrations of the Nitrogen ions are implanted separately in the first region 52 and in the second region 54. The different thickness of the oxide layers formed in the proceeding thermal process are not uniform.

The pulsed Nitrogen ion implantation process 60 is performed to provide a thin distribution of the Nitrogen ions on the surface of the doped silicon 51 in the present invention. The thickness of the gate oxide layer 62 is limited in the subsequent thermal oxidation process. The surface of the silicon doped with the different dosage of the Nitrogen ions is used to match up the surface of the silicon undoped with the Nitrogen ions in the other embodiments of the present invention. Three or more different thickness" of the gate oxide layers are formed in the one thermal oxidation process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming an oxide layer with different thickness on a semiconductor substrate comprising a bare silicon surface, the oxide layer doped using a nitrogen plasma, the silicon surface comprising a first region and a second region, the method comprising:

forming a first mask layer on the silicon surface covering the first region and the second region;

patterning the first mask layer to form a first hole in the first mask layer over the first region;

providing a pulse bias to form a nitrogen plasma environment, a nitrogen ion implantation process being simultaneously performed to implant a predetermined concentration of nitrogen ions to form a doped area of nitrogen ions having a thickness less than 100 angstroms in the silicon surface of the first region through the first hole;

removing the first mask layer; and performing an oxidizing process to simultaneously form a first thickness and a second thickness of a silicon oxide layer in the first region and in the second region, respectively;

wherein the nitrogen plasma formed in-situ by the pulse bias performs the nitrogen ion implantation in a thin region of the silicon surface so that damage to the silicon surface is reduced to maintain an ideal structure of the silicon oxide.

2. The method of claim 1 wherein the first thickness is thinner than the second thickness.

3. The method of claim 1 wherein the predetermined concentration is between $1 \times 10^{19}$ atoms/cm$^3$ and $1 \times 10^{22}$ atoms/cm$^3$.

4. The method of claim 1 wherein an implantation energy of the nitrogen ions in the nitrogen ion implantation process is between 200 eV and 10 KeV with an implantation dosage between $1 \times 10^{13}$ cm$^{-2}$ and $1 \times 10^{15}$ cm$^{-2}$.

5. The method of claim 1 wherein an implantation energy of the nitrogen ions in the nitrogen ion implantation process is about 200 eV with an implantation dosage of about $1 \times 10^{15}$ cm$^{-2}$, an implantation depth in the first region of about 50 angstroms, and a distribution of nitrogen ions greater than 80%.

6. The method of claim 1 wherein the first mask layer comprises a photoresist.

7. The method of claim 1 wherein the oxidation process is a dry furnace oxidation process with a reaction temperature between 700° C. and 950° C.

8. The method of claim 1 wherein the pulsed bias is a negative pulse bias, and the pulsed bias is used to refresh the nitrogen ions in the nitrogen ion implantation process.

9. A method of simultaneously forming different thicknesses of a silicon oxide layer, the method comprising:

providing a semiconductor substrate, the semiconductor substrate comprising a silicon surface, the silicon surface comprising a first region and a second region;

masking the silicon surface in the second region;

performing a first nitrogen ion implantation process in-situ to implant a first concentration of nitrogen ions in a thin region of the silicon surface in the first region;

masking the silicon surface in the first region;

performing a second nitrogen plasma ion implantation process in-situ to implant a second concentration of nitrogen ions in a thin region of the silicon surface in the second region, the first concentration being unequal to the second concentration; and performing an oxidation process to simultaneously form a first thickness and a second thickness of a silicon oxide layer on the silicon surface in the first region and the second region, respectively;

wherein the nitrogen plasma formed in-situ in the nitrogen plasma ion implantation process is produced by a pulse bias set in the semiconductor substrate and formed in-situ above the silicon surface of the semiconductor substrate.

10. The method of claim 9 wherein the first thickness is unequal to the second thickness.

11. The method of claim 9 wherein the first concentration is smaller than the second concentration, and the first thickness is thicker than the second thickness.

12. The method of claim 9 wherein the nitrogen plasma ion implantation process is performed in a vacuum chamber.

13. The method of claim 12 wherein the nitrogen plasma is produced by an interaction of the pulsed bias set in the semiconductor substrate, an upper electrode in the vacuum chamber, and a stable laminar flow of the nitrogen through the silicon surface of the semiconductor substrate.

14. The method of claim 13 wherein the pulse bias is a negative pulse bias that is used to refresh the nitrogen ions in the nitrogen ion implantation process.

15. The method of claim 12 wherein parameters to control the nitrogen plasma include a nitrogen flux, a pressure of the nitrogen, the pulse bias, a distance between an upper electrode and a lower electrode, and a response time.

16. The method of claim 9 wherein an implantation energy of the nitrogen ions in the nitrogen ion implantation process is between 200 eV and 10 keV, and an implantation dosage is between $1 \times 10^{13}$ cm$^{-2}$ and $1 \times 10^{15}$ cm$^{-2}$.

17. The method of claim 9 wherein an implantation energy of the nitrogen ions in the nitrogen ion implantation process is about 200 eV, an implantation dosage is about $1 \times 10^{15}$ cm$^{-2}$, and a nitrogen ion distribution on the silicon surface to a depth of 50 angstroms in the first region is about 80%.

18. The method of claim 9 wherein the oxidation process is a dry furnace oxidation process with a reaction temperature between 700° C. and 950° C.

19. The method of claim 9 wherein the first concentration is between $1 \times 10^{19}$ atoms/cm$^3$ and $1 \times 10^{22}$ atoms/cm$^3$.

20. The method of claim 9 wherein the second concentration is between $1 \times 10^{19}$ atoms/cm$^3$ and $1 \times 10^{22}$ atoms/cm$^3$.

* * * * *